United States Patent [19]

Doki et al.

[11] Patent Number: 5,231,057
[45] Date of Patent: Jul. 27, 1993

[54] METHOD OF DEPOSITING INSULATING LAYER ON UNDERLYING LAYER USING PLASMA-ASSISTED CVD PROCESS USING PULSE-MODULATED PLASMA

[75] Inventors: Masahiko Doki, Sagamihara; Junya Nakahira, Tokyo; Yuji Furumura, Yokohama, all of Japan

[73] Assignee: Fujitsu Limited, Kawasaki, Japan

[21] Appl. No.: 748,955

[22] Filed: Aug. 20, 1991

[30] Foreign Application Priority Data

Aug. 20, 1990 [JP] Japan .................................. 2-218615

[51] Int. Cl.$^5$ ......................................... H01L 21/203
[52] U.S. Cl. .................... 437/225; 437/238; 437/241; 437/978; 437/245; 427/571
[58] Field of Search .............. 437/225, 978, 238, 241, 437/245; 427/99, 47

[56] References Cited

U.S. PATENT DOCUMENTS

| | | | |
|---|---|---|---|
| 4,500,563 | 2/1985 | Ellenberger et al. | 427/38 |
| 4,837,185 | 6/1989 | Yau et al. | 437/228 |

FOREIGN PATENT DOCUMENTS

| | | |
|---|---|---|
| 0207767 | 1/1987 | European Pat. Off. . |
| 149965 | 6/1989 | Japan . |
| 2212974 | 8/1989 | United Kingdom . |

OTHER PUBLICATIONS

Olmer et al., "Intermetal dielectric deposition by plasma enhanced chemical vapor deposition," Fifth IEEE/CHMT International Electronic Manufacturing Technology Symposium, Lake Buena Vista, Fla., Oct. 10-12, 1988, pp. 98-99.

Primary Examiner—George Fourson
Attorney, Agent, or Firm—Staas & Halsey

[57] ABSTRACT

A method for producing a semiconductor device includes the steps of forming a patterned wiring line on a first insulating layer, and depositing a second insulating layer on the patterned wiring line and the first insulating layer by a plasma-assisted CVD process in which a pulse-modulated plasma is generated and a gas containing hydrogen is used.

8 Claims, 16 Drawing Sheets

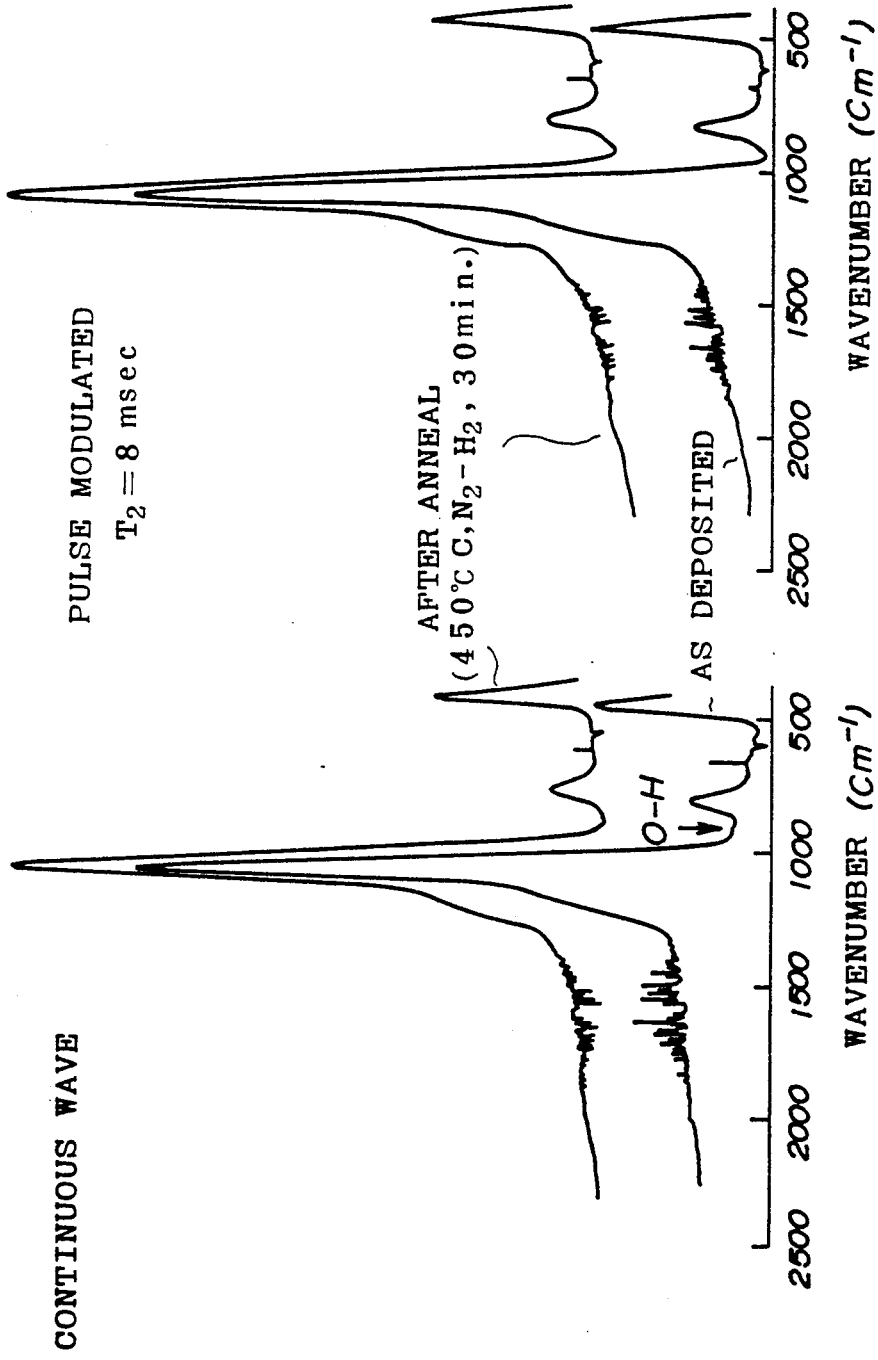

METHOD OF DEPOSITING INSULATING LAYER ON UNDERLYING LAYER USING PLASMA-ASSISTED CVD PROCESS USING PULSE-MODULATED PLASMA

BACKGROUND OF THE INVENTION (1) Field of the Invention

The present invention generally relates to a method of depositing an insulating layer using a plasma-assisted CVD (Chemical Vapor Deposition) process, and more particularly, to a method of depositing an insulating layer on an underlying layer using a low temperature plasma-assisted CVD process employing a pulse-modulated plasma.

(2) Description of the Prior Art

Conventionally, a plasma surface processing apparatus having parallel plate electrodes is widely used as a discharge reaction apparatus. The parallel plate electrodes are placed in a vacuum chamber having a gas intake system and a gas exhaust system. A direct current signal, an alternating current signal or a high-frequency signal generated by a signal source is applied across the parallel plate electrodes so that a discharged plasma (i.e., a plasma discharge) is generated. A wafer is placed on a plate which is heated by a heater or cooled by a gas or coolant and the surface of the wafer is processed by the above-mentioned discharged plasma.

There are many variations and modifications of the above-mentioned apparatus. For example, one type of plasma surface processing apparatus uses coaxial cylinder type electrodes instead of the parallel plate electrodes. Another apparatus uses a large number of electrodes. However, these conventional apparatuses have a common disadvantage in that the density of electrons contained in the discharged plasma is low and thus it takes a long time to process the surface of the wafer. Further, a layer formed by the discharged plasma has a very high thermal stress and a very large internal stress. In addition, the stress is uniformly exerted. Moreover, since the wafer is directly in contact with the discharged plasma, it is damaged due to the projection of electrified particles.

In order to eliminate the damage due to the direct projection of electrified particles, an improved apparatus has been proposed in which a discharged plasma is generated in a place away from the wafer, and only active pieces or ions contained in the discharged plasma are transported to a processed surface of the substrate. However, the above-mentioned proposed apparatus does not have a high discharged plasma density, so that it takes a long time to process the wafer surface. In order to increase the surface processing speed, it is necessary to apply a larger amount of power to the apparatus.

FIGS. 1(A) through 1(C) show a conventional method of producing a semiconductor integrated circuit device by a plasma-assisted CVD process, and FIG. 2 shows a conventional plasma-assisted CVD apparatus. The device shown in FIGS. 1(A) to 1(C) comprises a semiconductor substrate 31 made of, for example, silicon (Si), an insulating layer 32 made of, for example, PSG (Phospho-Silicate Glass), patterned wiring layers 33 formed of Al, and an insulating layer 34 formed of, for example, silicon oxide ($SiO_2$) and functioning as a cover (passivation) layer. The insulating layers 32 and 34 are deposited by the apparatus shown in FIG. 2 in the following way. A wafer 38 (corresponding to the substrate 31) is placed on an electrostatic chuck 37 in a vacuum reaction chamber 35. An RF (Radio Frequency) generator 40 generates a continuous wave, and a rectangular wave guide 36 transports the continuous wave to the chamber 35. The wafer 38 is heated by a heater 39.

At the production step shown in FIG. 1(A), the PSG layer 32 is deposited on the substrate 31 by a plasma-assisted CVD process in which a continuous wave is applied to the chamber 35 which is maintained at approximately 350° C. At the production step shown in FIG. 1(B), an Al layer is deposited on the entire surface of the PSG layer 32 by a sputtering process, and then patterned by an RIE (Reactive Ion Etching) process step, so that the Al wiring layers 33 are formed. At the production step shown in FIG. 1(C), using the apparatus shown in FIG. 2, the $SiO_2$ layer 34 is deposited on the entire surface by the plasma-assisted CVD process in which the continuous wave is applied to the chamber 35 and the plasma is continuously generated.

The above-mentioned plasma-assisted CVD process is superior to a normal CVD process in that the former process can be performed at a temperature (about 350° C.) lower than that of the latter process (about 400° C.). However, the qualities of layers formed by the plasma-assisted CVD process are not better than those of layers formed by the normal CVD process. This problem is more frequently encountered as the deposition temperature decreases.

Conventionally, the continuous plasma generation is employed in order to obtain the large amount of power necessary to deposit the insulating layers 32 and 34 at a high speed and thereby to improve the shapes of stepped parts thereof (coverage). During the deposition process, the wafer 38 is continuously biased. Thus, hydrogen groups are actively implanted in the insulating layer being deposited due to the ion bombardment effect, so that hydrogen groups, particularly O—H groups, are contained in the insulating layers 32 and 34. When the insulating layers 32 and 34 containing the O—H groups are heated, a great change in the internal stress (for example, detachment of hydrogen groups in the insulating layers 32 and 34 and a resultant bonding rearrangement) is liable to take place. Such a great change in the internal stress degrades the quality of the insulating films 32 and 34.

SUMMARY OF THE INVENTION

It is an object of the present invention to provide a method of depositing an insulating layer on an underlying layer by using an improved low-temperature plasma-assisted CVD process.

A more specific object of the present invention is to provide a method of depositing an insulating layer on an underlying layer using an improved low-temperature plasma-assisted CVD process capable of producing a high-quality and good coverage insulating layer.

The above-mentioned objects of the present invention are achieved by a method comprising the steps of: (a) forming a patterned wiring line on a first insulating layer; and (b) depositing a second insulating layer on the patterned wiring line and the first insulating layer by a plasma-assisted CVD process in which a pulse-modulated plasma is generated and a gas containing hydrogen is used.

The above-mentioned objects of the present invention are also achieved by a method comprising the steps of: (a) depositing an insulating layer on an underlying layer by a plasma-assisted CVD process in which a pulse-modulated plasma is generated and a gas containing hydrogen is used; and (b) forming a patterned wiring line on the insulating layer, wherein the step (a) comprises the step of generating a pulse-modulated microwave in a chamber, the pulse-modulated microwave having a ratio of a pulse width to a cycle time which is between approximately 50% and 80% and having the cycle time between 4.0 ms and 10.0 ms.

BRIEF DESCRIPTION OF THE DRAWINGS

Other objects, features and advantages of the present invention will become more apparent from the following detailed description when read in conjunction with the accompanying drawings, in which:

FIG. 7A is a diagram showing infrared absorption spectra of an insulating layer deposited by the conventional process;

FIG. 7B is a diagram showing infrared absorption spectra of an insulating layer deposited by the present invention;

DESCRIPTION OF THE PREFERRED EMBODIMENTS

According to the present invention, a pulse-modulated plasma is generated in order to deposit an insulating layer on an underlying layer. During the pulse-modulated plasma deposition, a pulse-modulated microwave is emitted in a plasma chamber and simultaneously a wafer (substrate) placed in a reaction chamber close to the plasma chamber is intermittently biased.

Figure 1A:
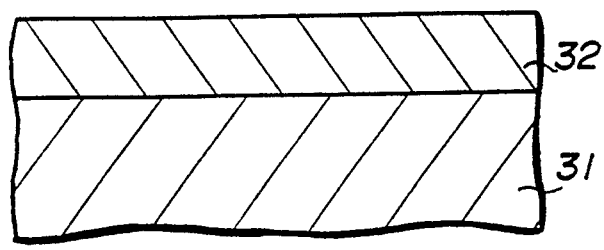
FIGS. 1A through 1C are cross-sectional views showing successive steps of a conventional semiconductor device production method using a low-temperature plasma-assisted CVD process.
Figure 1B:
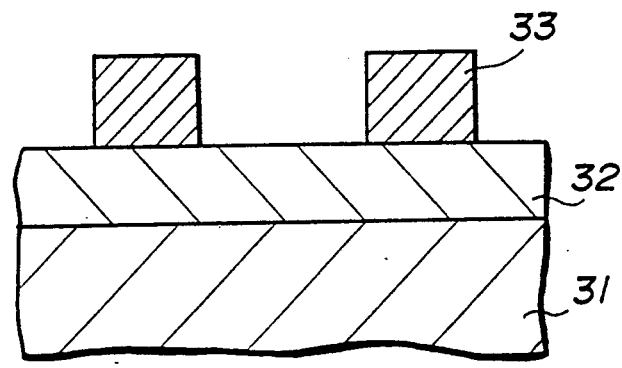
Figure 1C:
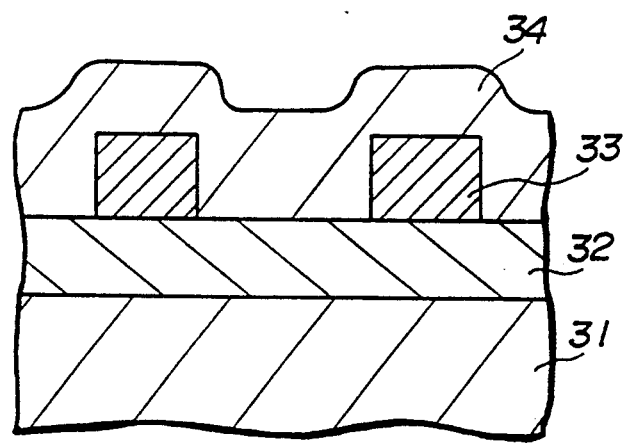
Figure 2:
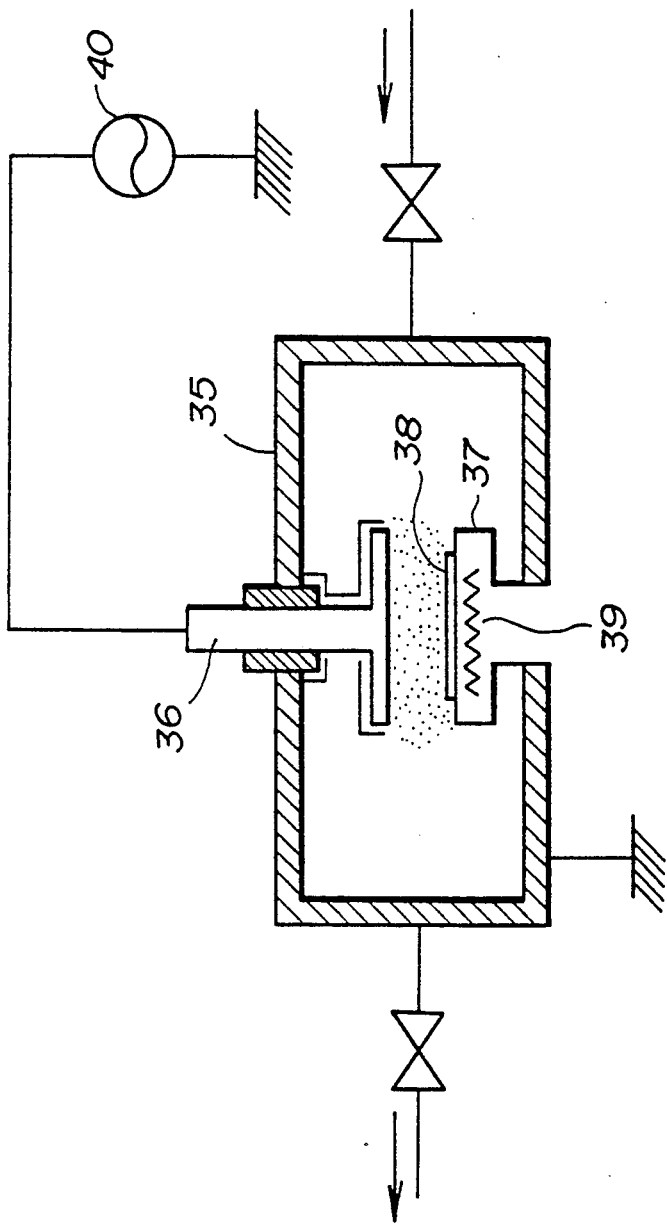
FIG. 2 is a diagram of an ECR plasma-assisted CVD apparatus used for depositing insulating layers of the device shown in FIG. 1(A) to 1(C)
Figure 3:
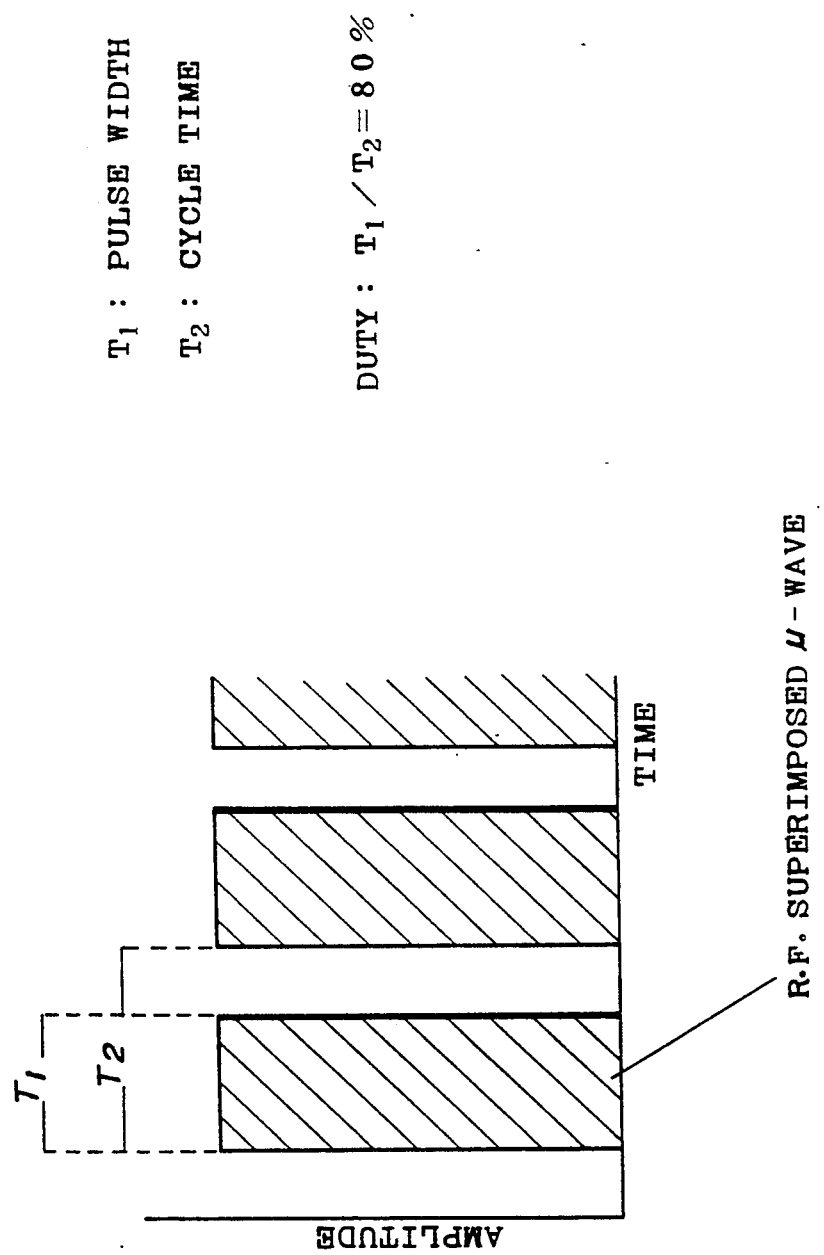
FIG. 3 is a waveform diagram of a pulse signal applied to a microwave generator, such as a magnetron, or an RF bias generator according to the present invention.

FIG. 3 is a waveform diagram, of an RF superimposed microwave emitted in the plasma chamber. As shown in FIG. 3, the microwave is intermittently emitted. T1 is the pulse width of the pulse-shaped microwave signal, and T2 is the cycle time T2. The duty ratio T1/T2 is set equal to, for example, 80%. The wafer is intermittently biased by applying, to the wafer, an RF signal having the same duty ratio as that of the pulse-shaped microwave.

Figure 4:
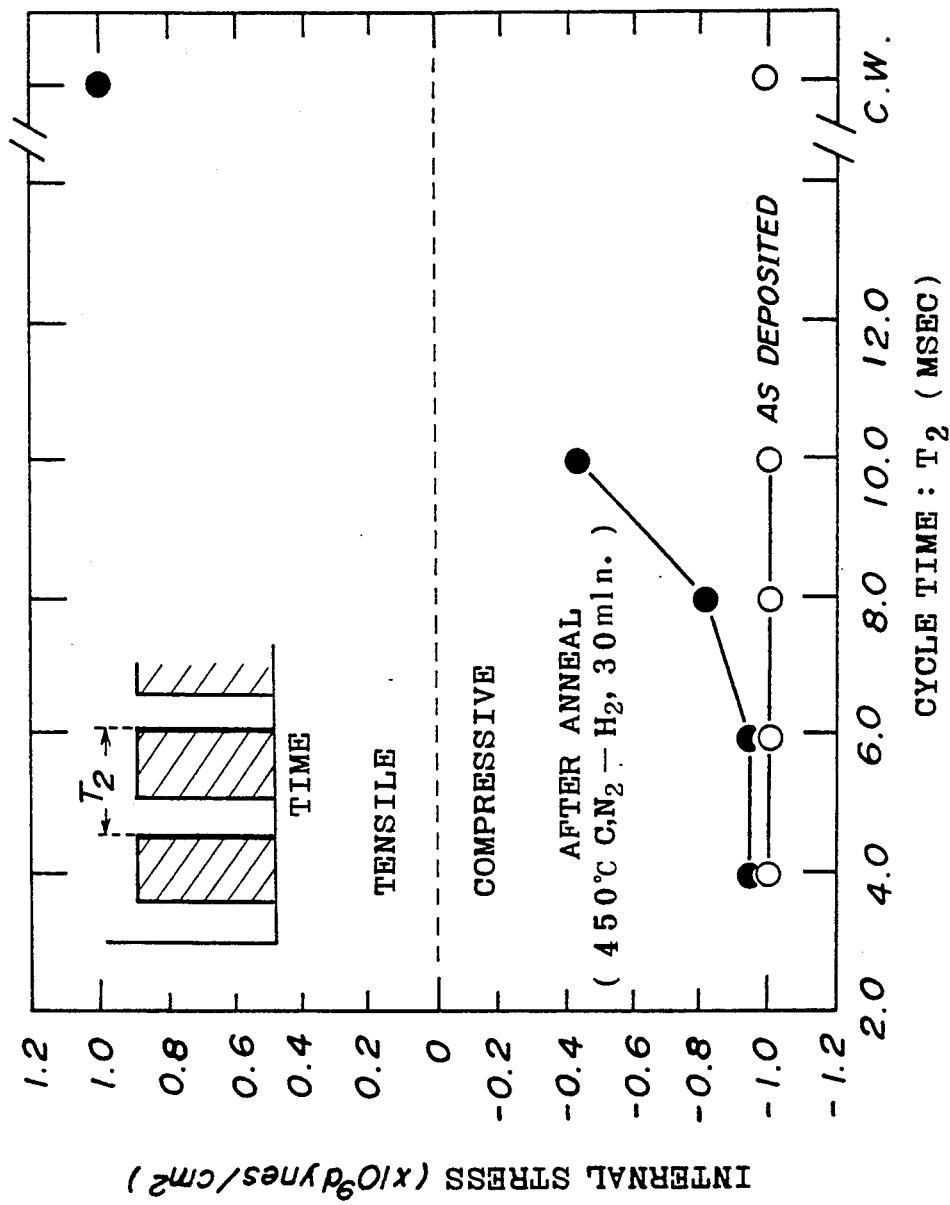
FIG. 4 is a graph showing changes in the internal stress in insulating layers deposited by the present invention and the conventional process.

FIG. 4 is a graph showing the relationship between the internal stress ($\times 10^9$ dynes/cm$^2$) in an SiO$_2$ insulating layer deposited with the duty ratio T1/T2 equal to 80% where T1 and T2 are respectively equal to 8 ms and 10 ms. The wafer is also intermittently biased in the same ratio condition. The peak power of the microwave is equal to 400 W. In FIG. 4, "C.W." denotes continuous wave plasma deposition. The internal stress in an as-deposited insulating layer deposited by continuous wave plasma deposition is approximately equal to $-1.0 \times 10^9$ dynes/cm$^2$. When such an as-deposited insulating layer is annealed in an N$_2$—H$_2$ gas at 450° C. for 30 minutes, the internal stress in the annealed insulating layer becomes approximately equal to $1.0 \times 10^9$ dynes/cm$^2$. That is, the internal stress is greately changed by the annealing process. On the other hand, when the cycle time T2 of the microwave pulse is equal to 10.0 ms, the internal stress is equal to about $-1.0 \times 10^9$ dynes/cm$^2$. Even when the cycle time T2 shortens, the internal stress is approximately equal to $-1.0 \times 10^9$ dynes/cm$^2$. When the as-deposited insulating layer, deposited by using the microwave pulse, is annealed in the same condition as described above, the internal stress does not change greatly for a cycle time equal to or less than 10.0 ms. Thus, the pulse-modulated plasma generation is very useful for preventing the degradation in the quality of the insulating film arising from the annealing process.

It should be noted that the internal stress in the insulating layer deposited by the continuous microwave changes from compressive stress to tensile stress when it is annealed. This change in the internal stress will damage wiring lines which are in contact with the insulating layer. On the other hand, the internal stress in the insulating layer deposited by the pulse-modulated plasma with the cycle time T2 equal to or shorter than 10.0 ms is continuously compressive after it is annealed. This ensures that wiring lines in contact with the insulating layer will be not damaged.

It should be noted that there are no plots at a cycle time T2 shorter than 4.0 ms because the available measurement instruments do not show such indications. However, it is considered that the same effect as described above will be obtained at up to a cycle time of $2.5 \times 10^9$ dynes/cm$^2$. The duty ratio T1/T2 is not limited to 80%. It is possible to select the duty ratio T1/T2 to be between about 50% and 80%. With the above-mentioned duty ratio T1/T2 and the cycle time T2 in mind, it is preferable that the OFF period (=T2−T1) is approximately equal to or longer than 0.5 ms. When the OFF period is shorter than 0.5 ms, the pulse-modulated plasma is substantially identical to the continuous wave plasma.

Figure 5:
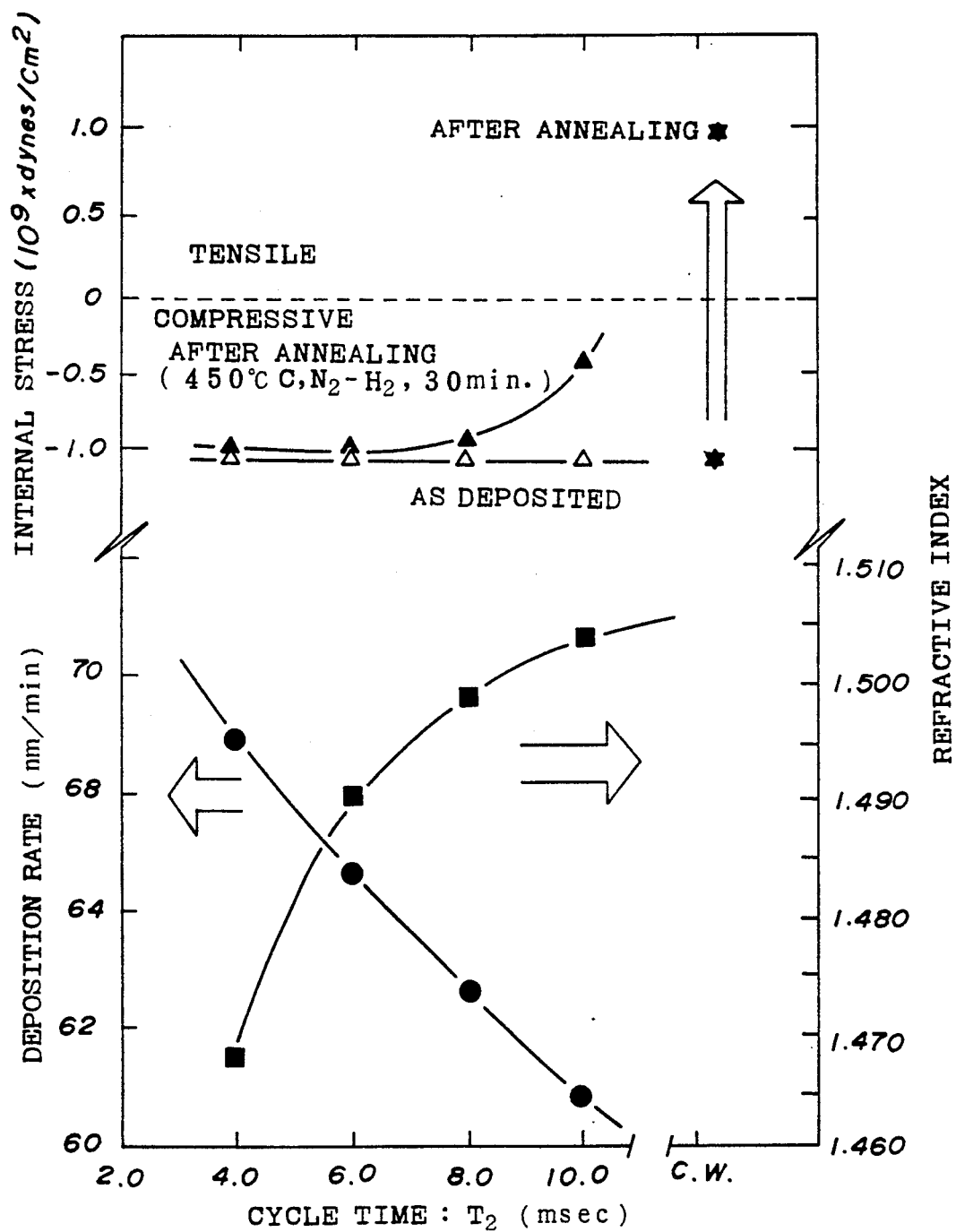
FIG. 5 are graphs showing the cycle time dependent characteristics of insulating layers deposited by the present invention.

FIG. 5 is a graph showing, together with the relationship shown in FIG. 4, the relationship between the deposition rate (nm/min) and the cycle time T2 (msec). When the plasma is continuously generated, the deposition rate is estimated as 3.0 (nm/min) and the refractive index of the deposited insulating layer is estimated as 1.55 (although both numerals are not shown). On the other hand, as the cycle time T2 shortens, the deposition rate increases and the refractive index of the insulating layer decreases. That is, these parameters depend on the cycle time T2. Thus, it is possible to obtain a desired deposition rate and a desirable refractive index by changing the cycle time. It will be noted that the refractive index is one of the most important parameters defining the nature of insulating layers.

Figure 6:
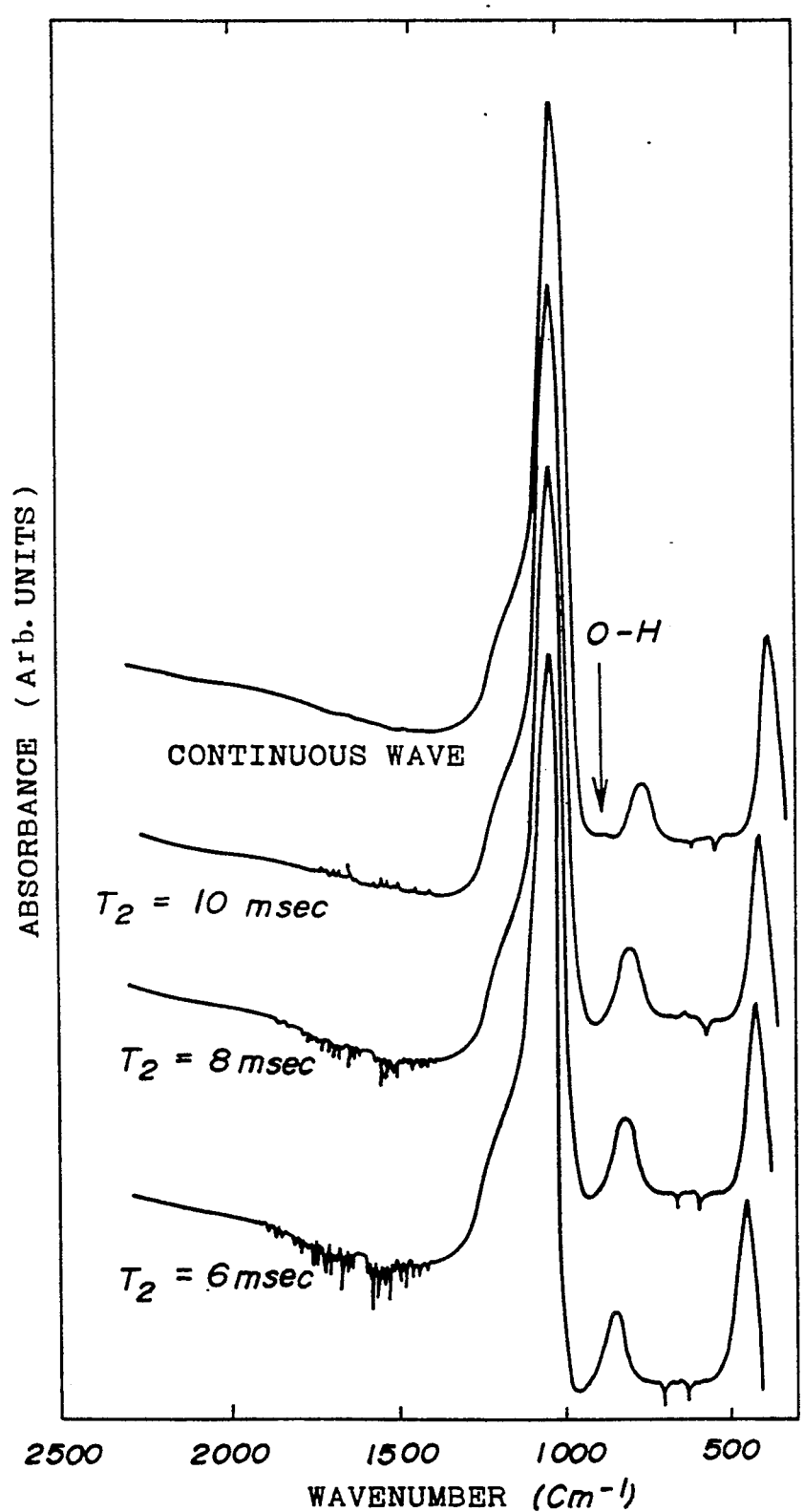
FIG. 6 is a diagram showing respective infrared absorption spectra of insulating layers deposited by the present invention and by the conventional process.

FIG. 6 shows infrared absorption spectra in which the vertical axis represents the absorbance (arbitrary unit) of $SiO_2$ insulating layers and the horizontal axis represents the wavenumber ($cm^{-1}$). When the insulating layer is deposited by the continuously generated plasma, a large O—H peak is observed. On the other hand, the insulating layers deposited by the pulse-modulated plasma have little O—H peaks for cycle times T2 equal to 10, 8 and 6 ms. This fact shows that the insulating layers deposited by the pulse-modulated plasma contain only a few O—H groups.

FIG. 7A shows infrared absorption spectra of an $SiO_2$ layer deposited by using the continuously generated plasma, and FIG. 7B shows infrared absorption spectra of an $SiO_2$ layer deposited by using the intermittently generated plasma. As shown in FIG. 7A, the as-deposited $SiO_2$ layer has an O—H peak. Even after the as-deposited $SiO_2$ film is annealed under the same condition as described previously, the absorption characteristic of the annealed layer has an O—H peak. On the other hand, as shown in FIG. 7B, an as-deposited $SiO_2$ insulating layer has little O—H peak. Even after the as-deposited layer is annealed in the same way as described previously, the absorption graph does not have any O—H peak.

The experimental results shown in FIGS. 6, 7A and 7B clearly support the experimental results shown in FIG. 4. It can be seen from FIGS. 6, 7A and 7B that an extremely reduced number of O—H groups is contained the $SiO_2$ insulating layer deposited by the present invention, and thus it is possible to suppress the damage of the device, hot electron effects and movement of moisture components toward semiconductor interfaces. The suppression of the movement of moisture components will contribute to suppressing variations in the semiconductor interface levels.

Figure 8A:
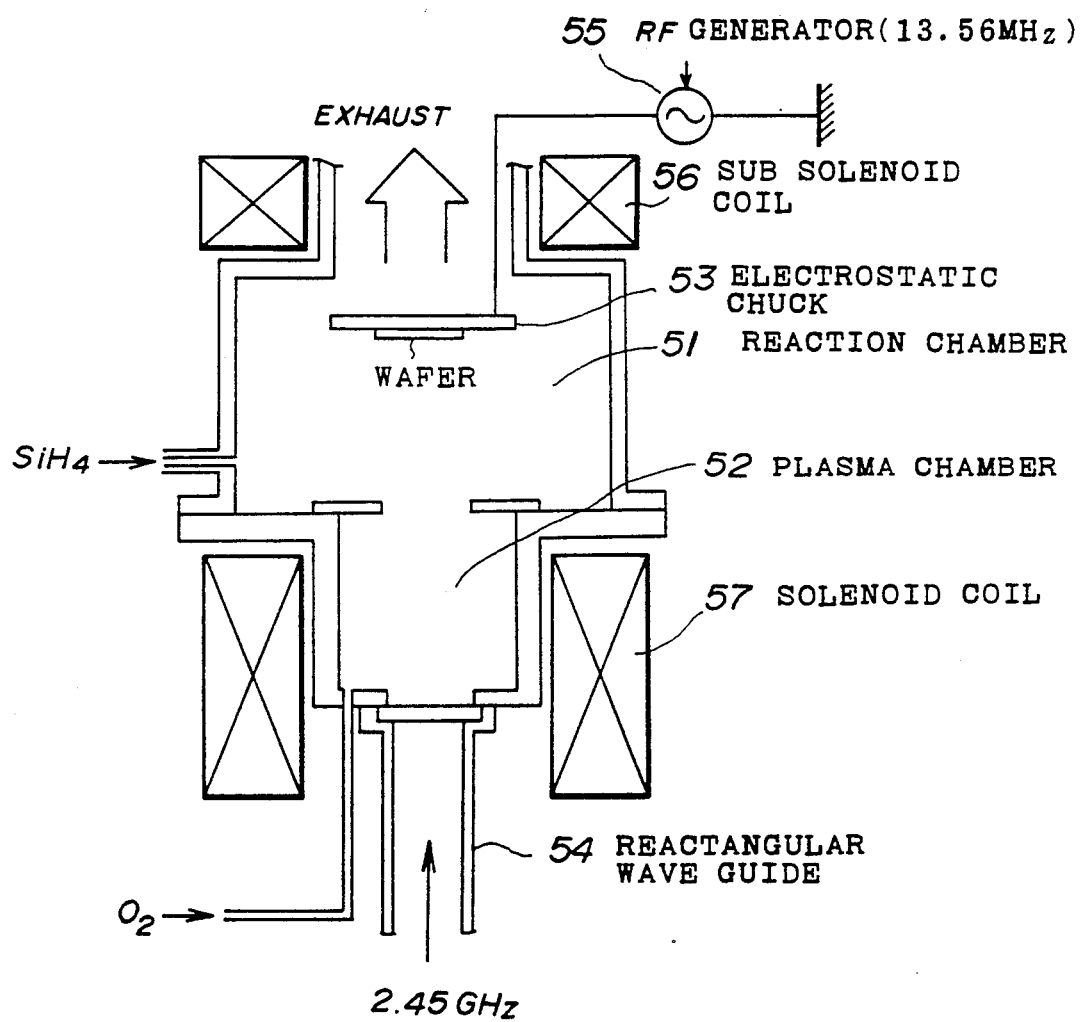
FIGS. 8A and 8B are diagrams of a low-temperature plasma-assisted CVD apparatus used in the present invention.
Figure 8B:
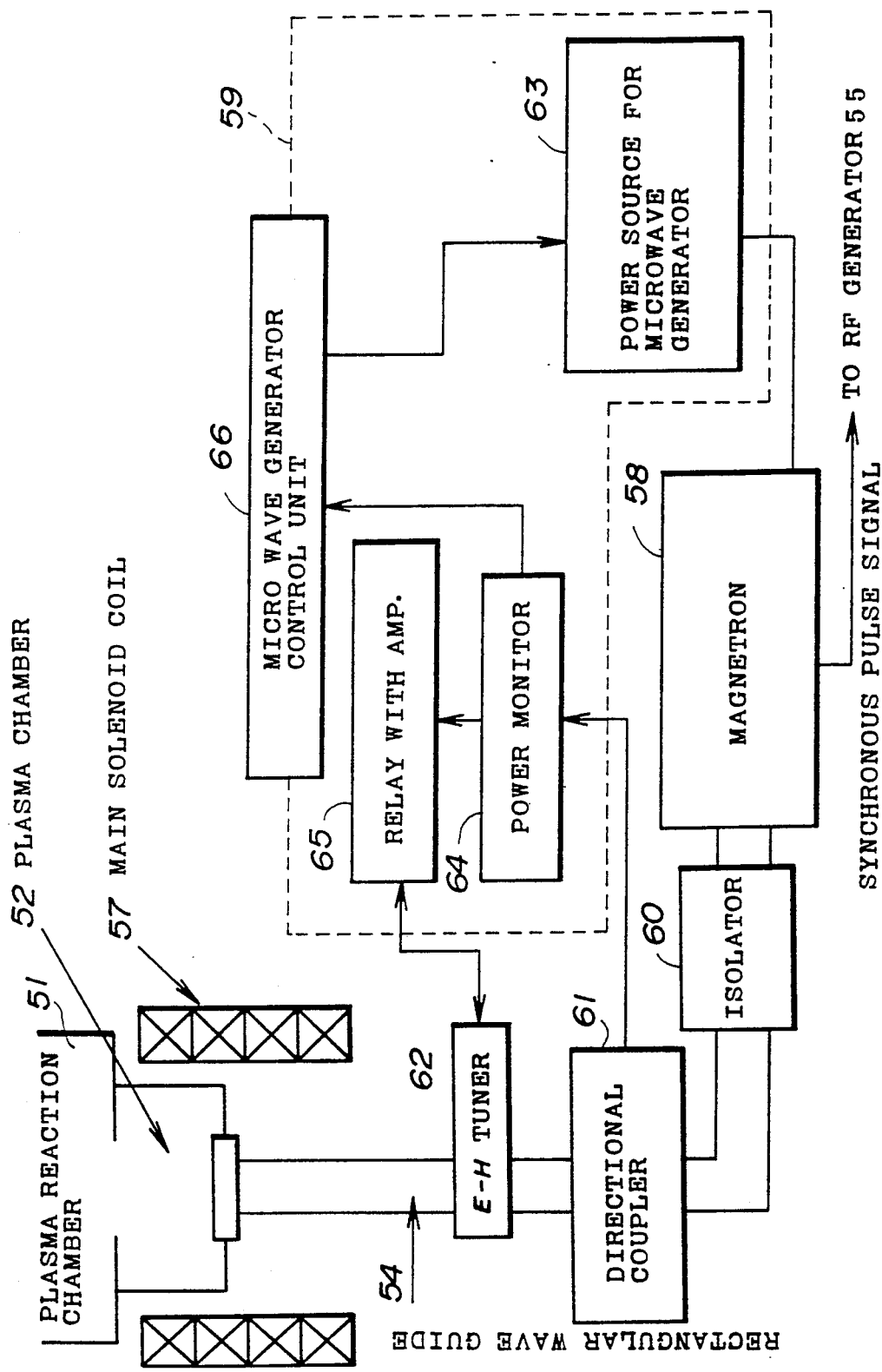
Figure 9B:
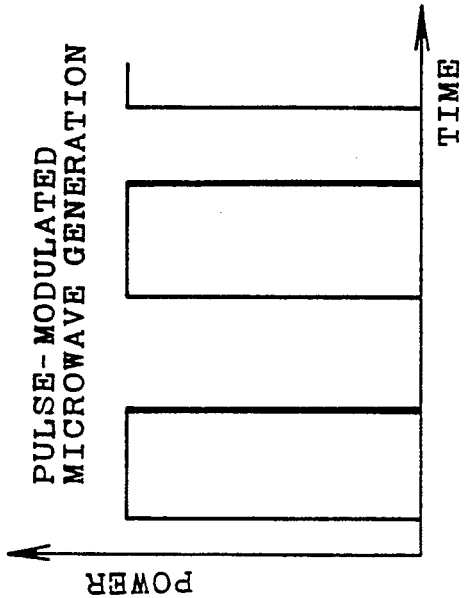
FIGS. 9A and 9B are waveform diagrams of a (conventional) continuous microwave and of a pulse-modulated microwave respectively.
Figure 9A:
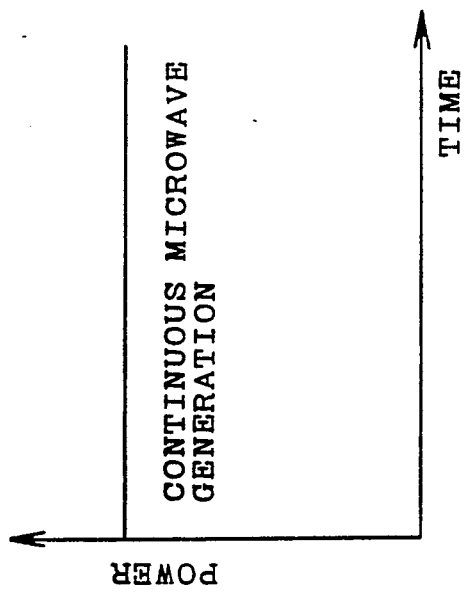
Figure 9C:
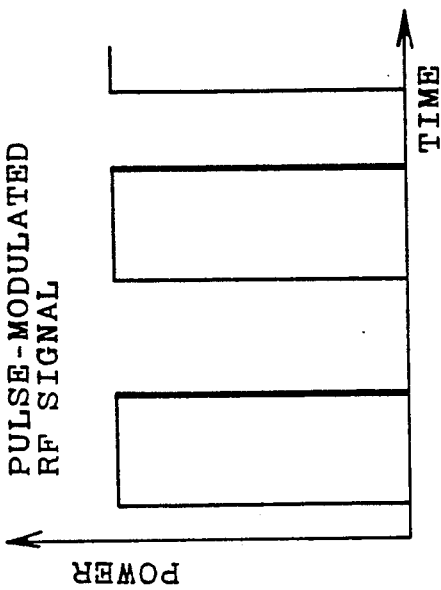
FIGS. 9C and 9D are waveform diagrams of a (conventional) continuous RF signal and of a pulse-modulated RF signal; successive steps of FIGS. 10A through 10C are diagrams showing a semiconductor device production process using the present invention.
Figure 9D:
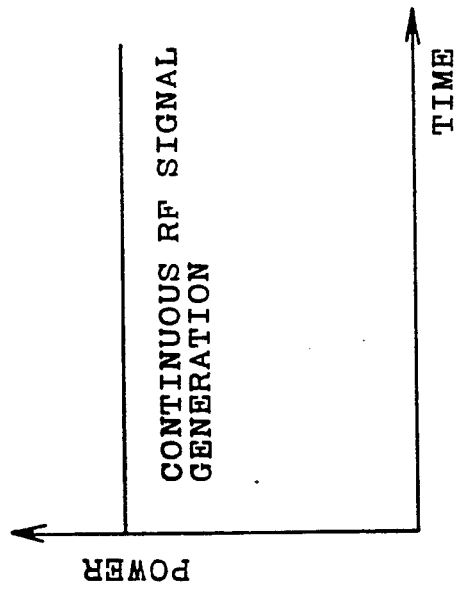

FIGS. 8A and 8B are diagrams of a low-temperature plasma-assisted CVD apparatus which implements the insulating film deposition method according to the present invention. As shown in FIG. 8A, the apparatus includes a reaction chamber 51, a plasma chamber 52, an electrostatic chuck 53, a rectangular wave guide 54, an RF generator 55, a sub solenoid coil 56 and a main solenoid coil 57. As shown in FIG. 8B, the apparatus further includes a microwave generator 58, such as a magnetron, a microwave power controller 59, an isolator 60, a directional coupler 61 and a tuner 62. The microwave power controller 59 is made up of a microwave power supply unit 63, a power monitor 64, a relay 65 with an amplifier and a power control panel 66. The magnetron 58 generates a pulse-shaped microwave containing a component having a frequency of, for example, 2.45 GHz, as shown in FIG. 9B. FIG. 9A shows a continuous microwave generated by a magnetron in the conventional way. As has been described previously, it is preferable that the duty ratio T1/T2 be between 50% and 80% and the cycle time T2 be equal to or shorter than 10 ms. A synchronous pulse signal derived from the magnetron 58 is applied signal having a frequency of, for example, 13.56 MHz, as shown in FIG. 9D. FIG. 9C shows a continuous RF pulse signal generated by an RF generator in the conventional way. The RF generator 55 generates the RF pulse signal having the same duty ratio and the same cycle time as those of the pulse-shaped microwave generated by the magnetron 58. The pulse-shaped microwave passes through the isolator 60, the directional coupler 61, the tuner 62 and the rectangular wave guide 54, and is applied to the plasma chamber 52. The tuner 62 passes only the component having the frequency equal to 2.45 GHz. The power of the 2.45 GHz microwave is monitored by the power monitor 64 and controlled so that it becomes equal to a predetermined value (for example, 400 W). As shown in FIG. 8A, an $SiH_4$ gas is introduced into the reaction chamber 51, and an $O_2$ or $N_2O$ gas is introduced in the plasma chamber 52 when an $SiO_2$ film is deposited.

Figure 10A:
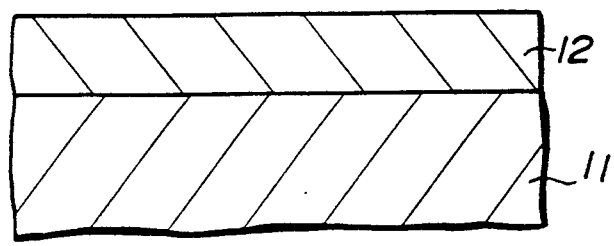
Figure 10B:
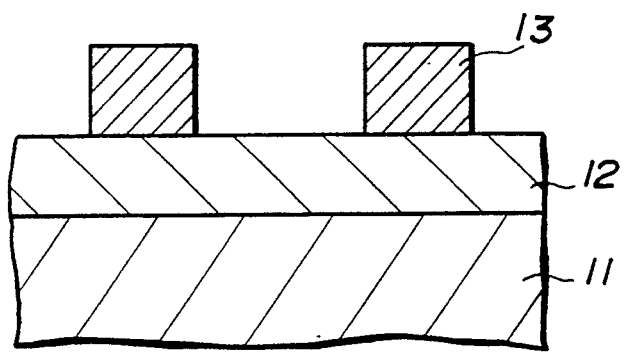
Figure 10C:
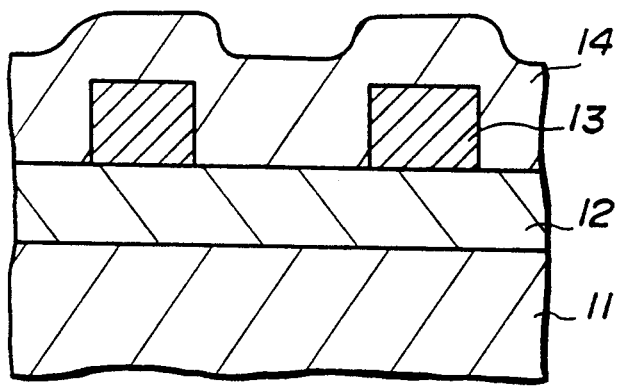
Figure 11:
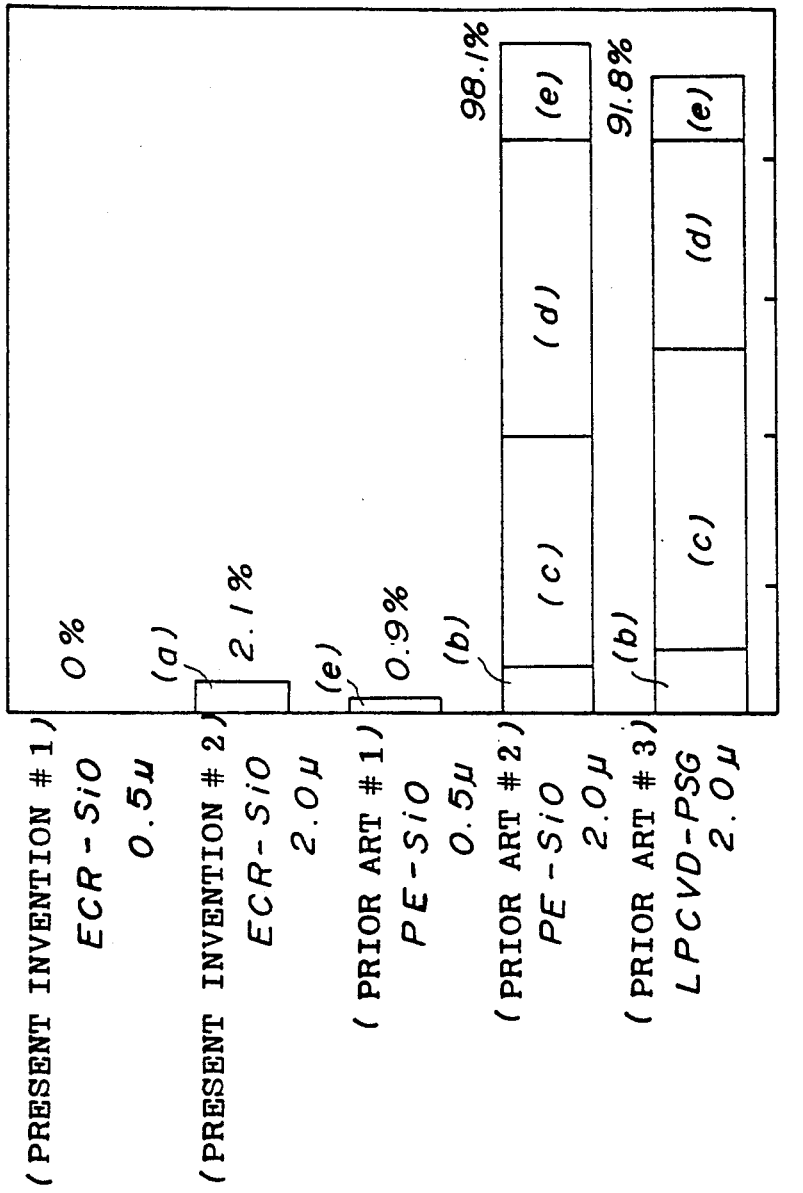
FIGS. 11 through 14 are diagrams showing the experimental results of an accelerated test.
Figure 12:
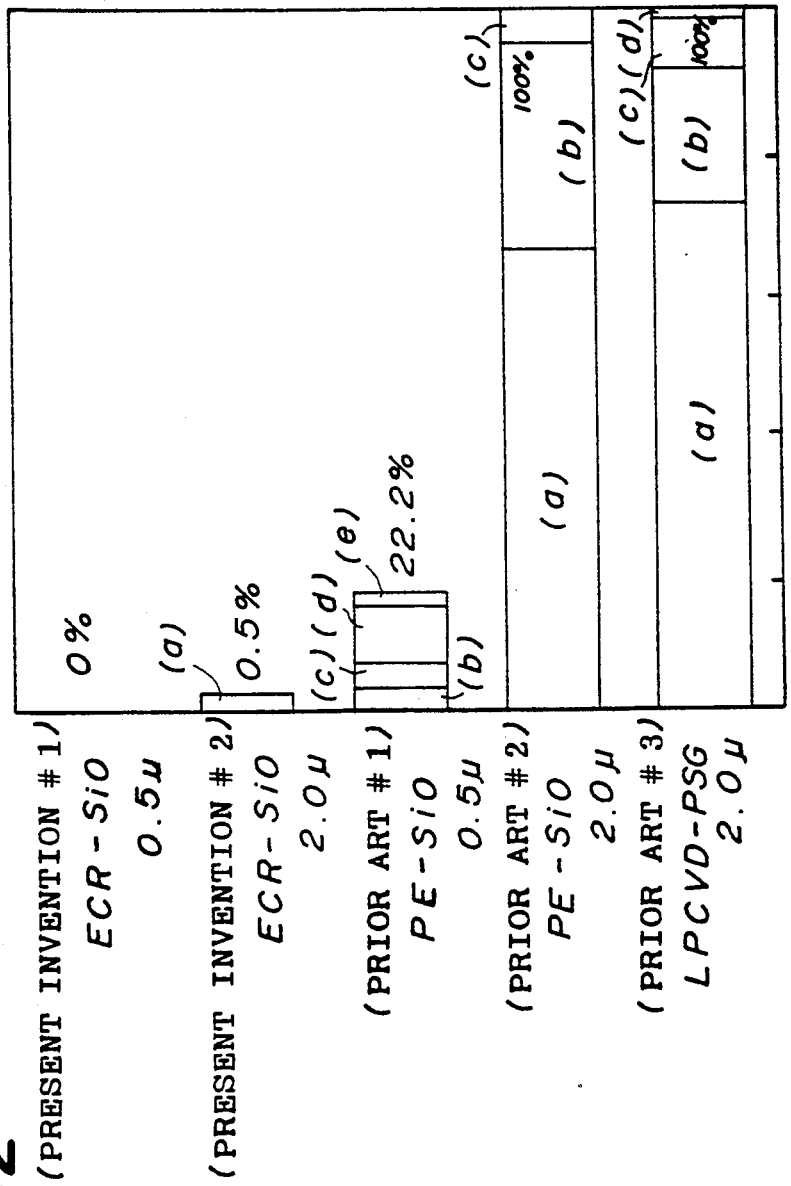
Figure 13:
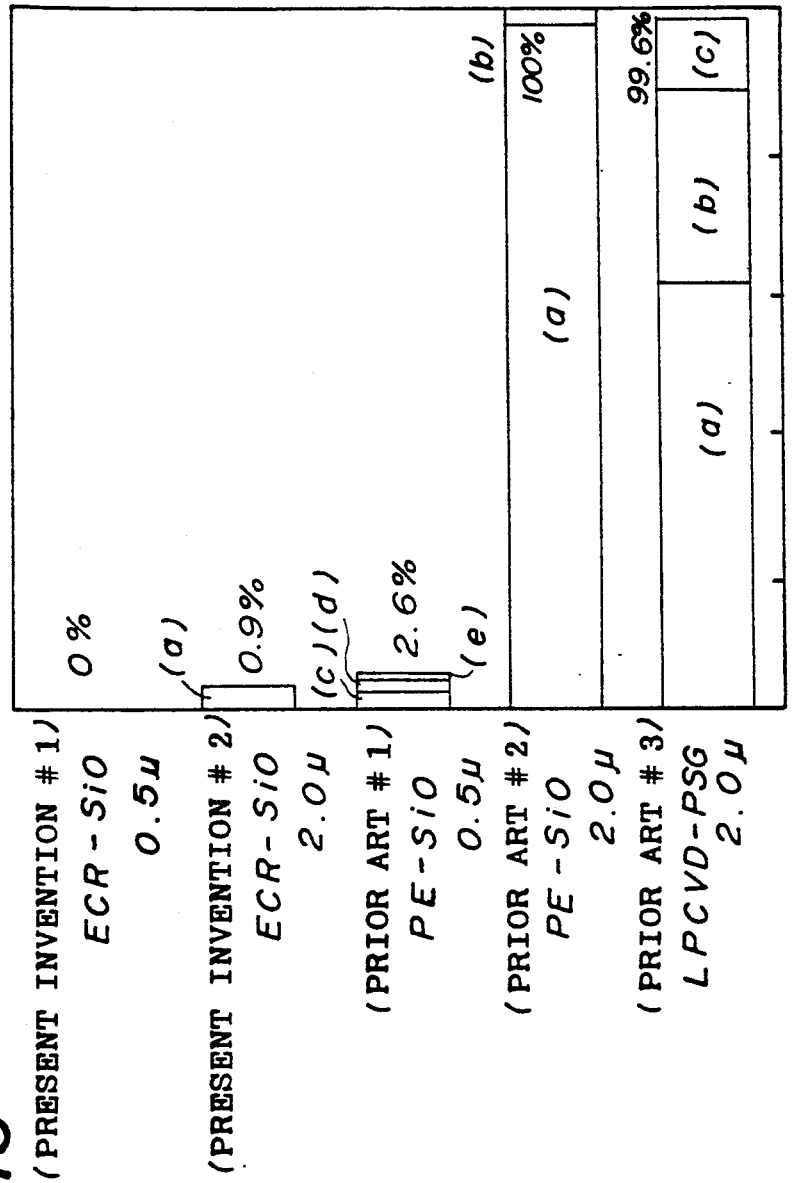
Figure 14:
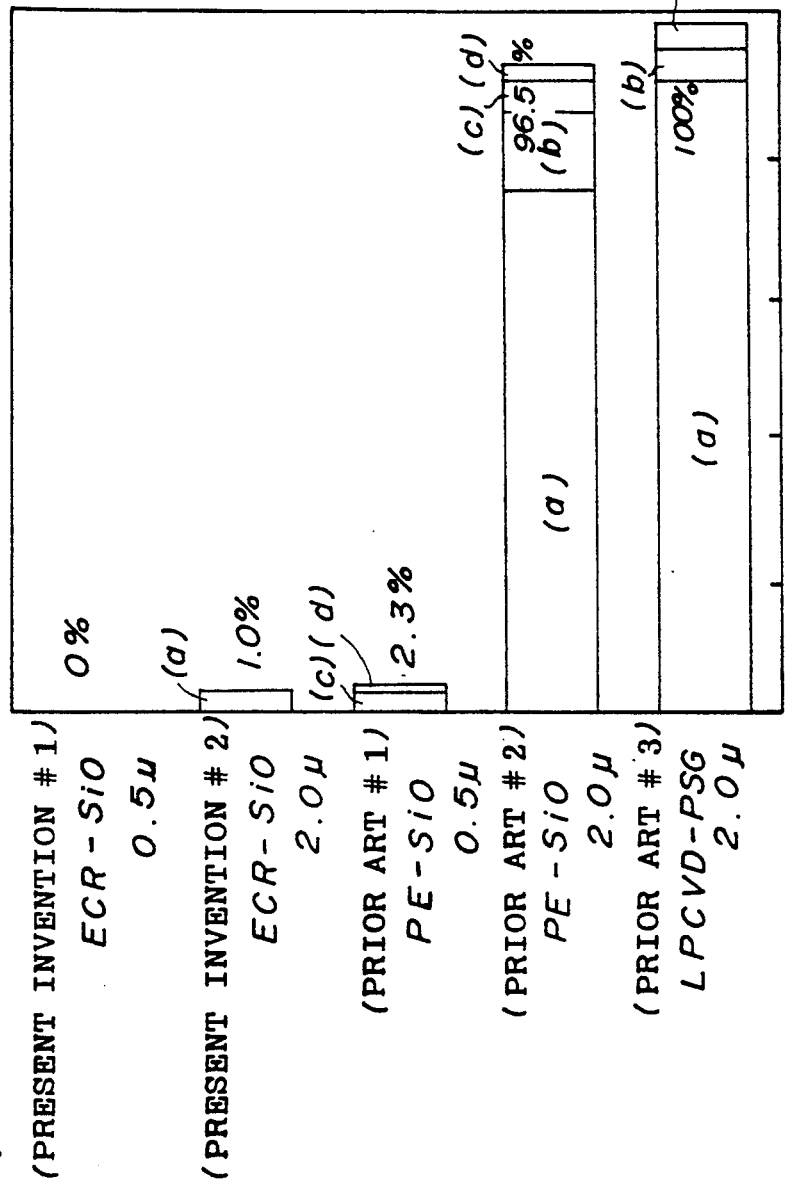

FIGS. 10A through 10C show successive steps of a semiconductor device production process using the present invention. As shown in FIG. 10A, by the aforementioned pulse-modulated plasma, a PSG insulating layer 12 is deposited to, a thickness of for example, 0.6 $\mu$m on a semiconductor substrate 11 made of, for example, silicon in an $SiH_4 + N_2O$ gas. For example, the peak power of the pulse-modulated microwave is 400 W, the pulse ON time is 8 ms, and the pulse OFF time is 2 ms. Subsequently, as shown in FIG. 10B, an Al layer is deposited to, a thickness of for example, 0.7 $\mu$m on the entire surface of the PSG insulating layer 12 by sputtering, and then patterned by an RIE etching process, so that Al wiring layers 13 are formed on the insulating layer 12.

Thereafter, as shown in FIG. 10C, by using the pulse-modulated plasma, an $SiO_2$ layer 14 having a thickness of about 0.5 $\mu$m is deposited on the entire surface of the device, so that the wiring patterns 13 are covered by the $SiO_2$ layer 14. Then, the device is annealed.

FIGS. 11 through 14 are graphs showing the experimental results of an accelerated test for measuring the stress migration characteristics of Al wiring layers covered by $SiO_2$ insulating layers (samples) deposited by the processes, respectively, of the present invention and the prior art. The horizontal axis of each graph shows the ratio of the number of samples in which the breaking of a wire take places to the total number of samples. The vertical axis of each graph represents five different types of samples. Samples labeled "PRESENT INVENTION #1" and "PRESENT INVENTION #2" have $SiO_2$ layers respectively deposited to thickness of 0.5 $\mu$m and 2.0 $\mu$m according to the present invention. Samples labeled "PRIOR ART #1", "PRIOR ART #2" and "PRIOR ART #3" have insulating layers respectively deposited to 0.5 $\mu$m, 2.0 $\mu$m and 2.0 $\mu$m according to the conventional processes (PE and LPCVD). In each of the graphs of FIGS. 11 through 14, (a), (b), (c), (d) and (e) are times during which the samples are left as they are at a temperature, and are more specifically equal to 168 H (hours), 336 H, 539 H, 793 H and 1013 H, respectively. In the graphs of FIGS. 11 through 14, the temperatures at which the samples are left are equal to 100° C., 150° C., 200° C. and 250° C., respectively. The Al wiring layer of each sample, which contains 1% Si by weight, has the dimensions shown in FIGS. 11 through 14. It can be seen from FIGS. 11 through 14 that the rate of occurrence of the breaking of a wire according to the present invention is very much smaller than that according to the conventional ways.

The present invention is useful to deposit not only the SiO₂ and PSG insulating layers but also other insulating layers such as SiN and SiON insulating layers. Further, the present invention is effective to deposit insulating polymers, such as SOG (Spin-On-Glass) and silica gel.

It is possible to use an RF signal instead of the microwave. It is possible to use the above-mentioned condition of the duty ratio and the cycle time for insulating layers other than SiO₂ layers. It is possible to change the parameter condition during the deposition in order to obtain a desired characteristic of the insulating layers. The present invention is not limited to the specifically disclosed embodiments, and variations and modifications may be made without departing from the scope of the present invention.

What is claimed is:

1. A method comprising the steps of:
   (a) forming a patterned wiring line on a first insulating layer; and
   (b) depositing a second insulating layer on said patterned wiring line and said first insulating layer by a plasma-assisted CVD process employing a pulse-modulated plasma which is generated, in a space surrounded by a solenoid coil, by a magnetic field produced by the solenoid coil and the source gas contains hydrogen.

2. A method as claimed in claim 1, wherein said step (b) comprises the step of generating a pulse-modulated microwave in a chamber, said pulse-modulated microwave having a pulse width to cycle time ratio which is between approximately 50% and 80% and a cycle time of a selected value in the range of 4.0 ms to 10.0 ms.

3. A method as claimed in claim 2, wherein:
   said step (b) further comprises simultaneously biasing a substrate which supports said first insulating layer by applying a pulse-modulated bias signal, which is synchronized with the pulse-modulated microwave, to said substrate; and
   said pulse-modulated bias signal has a pulse width to cycle time ratio which is between approximately 50% and 80% and a cycle time of the same selected value in the range of 4.0 ms to 10.0 ms.

4. A method as claimed in claim 1, wherein step (b) comprises the step of generating said pulse-modulated plasma during successive ON intervals spaced by respective, alternate OFF intervals, each OFF interval being equal to or longer than approximately 0.5 ms.

5. A method as claimed in claim 1, wherein said method further comprises the step of annealing said first and second insulating layers and said patterned wiring line.

6. A method as claimed in claim 1, wherein said second insulating layer comprises silicon dioxide.

7. A method as claimed in claim 1, wherein said second insulating layer comprises silicon nitride.

8. A method as claimed in claim 1, wherein said second insulating layer comprises phospho-silicate glass.

* * * * *

UNITED STATES PATENT AND TRADEMARK OFFICE
CERTIFICATE OF CORRECTION

PATENT NO. : 5,231,057
DATED : July 27, 1993
INVENTOR(S) : DOKI et al.

It is certified that error appears in the above-indentified patent and that said Letters Patent is hereby corrected as shown below:

On title page, item, [56] References Cited, after "OTHER PUBLICATIONS" insert:

Wolf et al., <u>Silicon Processing for the VLSI Era, Volume I: Process Technology</u>, 1986, pages 188-189.

Col. 2,    line 10, after "chamber 35" insert --,--.

Col. 3,    line 53, after "signal" insert --, respectively--, and delete "successive steps of";
    line 54, after "showing" insert --successive steps of--.

Col. 5,    line 38, after "contained" inset --in--;
    line 68, after "applied" insert --to the RF generator 55, which generates an RF pulse--.

Col. 6,    line 22, after "to" delete "," and after "of" insert --,--;
    line 28, after "to" delete "," and after "of" insert --,--;
    line 45, change "take places" to --takes place--.

Signed and Sealed this

Sixteenth Day of August, 1994

Attest:

BRUCE LEHMAN

*Attesting Officer*    *Commissioner of Patents and Trademarks*